(12) United States Patent
Goodhue

(10) Patent No.: US 6,933,244 B2
(45) Date of Patent: Aug. 23, 2005

(54) METHOD OF FABRICATION FOR III-V SEMICONDUCTOR SURFACE PASSIVATION

(75) Inventor: William D. Goodhue, Chelmsford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 232 days.

(21) Appl. No.: 10/340,481

(22) Filed: Jan. 10, 2003

(65) Prior Publication Data

US 2003/0219994 A1 Nov. 27, 2003

Related U.S. Application Data

(60) Provisional application No. 60/351,185, filed on Jan. 22, 2002.

(51) Int. Cl.[7] ............................................. H01L 21/31
(52) U.S. Cl. ..................... 438/767; 438/779; 438/952
(58) Field of Search ................................ 438/767, 779, 438/952

(56) References Cited

U.S. PATENT DOCUMENTS

| | | |
|---|---|---|
| 5,451,548 A | 9/1995 | Hunt et al. |
| 5,550,089 A | 8/1996 | Dutta et al. |
| 5,665,658 A | 9/1997 | Passlack |
| 5,821,171 A | 10/1998 | Hong et al. |
| 5,902,130 A | 5/1999 | Passlack et al. |
| 5,903,037 A | 5/1999 | Cho et al. |
| 5,912,498 A | 6/1999 | Hobson et al. |
| 5,962,883 A | 10/1999 | Hong et al. |
| 6,121,647 A | 9/2000 | Yano et al. |
| 6,451,711 B1 * | 9/2002 | Braddock, IV ............. 438/779 |

FOREIGN PATENT DOCUMENTS

| | | |
|---|---|---|
| EP | 0 987 746 | 3/2000 |
| EP | 1 001 468 A1 | 5/2000 |
| WO | WO 02/15233 | 2/2002 |
| WO | WO 02/41371 | 5/2002 |

OTHER PUBLICATIONS

"Demonstration of Enhancement–Mode p– and n– Channel GaAs Mosfets with $Ga_2O_3(Gd_2O_3)$ AS Gate Oxide," Ren et al. *Elsevier Science, Ltd.* 1997. 0038–1101. Great Britain.

"Effect of temperature on $Ga_2O_3(Gd_2O_3)$GaN metal–oxide–semiconductor field–effect transistors," Ren et al. *Applied Physics Letters.* Dec. 1998, vol. 73, No. 26.

"Epitaxial Cubic Gadolinium Oxide as a Dielectric for Gallium Arsenide Passivation," Hong et al. *Science.* Mar. 1999. vol. 283.

"Low Dit, Thermodynamically Stable $Ga_2O_3$–GaAs Interfaces: Fabrication, Characterization, and Modeling," Passlack et al. *IEEE Transactions on Electron Devices.* Feb. 1997. vol. 44, No. 2.

(Continued)

*Primary Examiner*—Alexander Ghyka
(74) *Attorney, Agent, or Firm*—Gauthier & Connors LLP

(57) ABSTRACT

A method passivates a surface of a semiconductor structure. The method provides III-V semiconductor material having a surface to be passivated. Upon the surface of the III-V semiconductor material to be passivated an oxide layer is formed. Thereafter, the surface of the III-V semiconductor material having the oxide layer is passivated, without desorption of the oxide layer and in a vacuum of $2 \times 10^{-6}$ Torr, with a material having the ability to intermix with the oxide layer so as to exchange oxygen, passivation layer material, and III-V semiconductor material therebetween to form graded layers of oxidized III-V and passivation material.

27 Claims, 4 Drawing Sheets

OTHER PUBLICATIONS

"$Ga_2O_3$ Films for Electronic and Optoelectronic Applications," Passlack et al. *Journal of Applied Physics*. Jan. 1995. vol. 77, No. 2.

"$Ga_2O_3(Gd_2O_3)$/InGaAs Enhancement–Mode n–Channel MOSFET's" Ren et al. *IEEE Electron Device Letters*. Aug. 1998. vol. 19, No. 8.

"Low Interface State Density Oxide–GaAs Structures Fabricated by in situ Molecular Beam Epitaxy," Hong et al. *Journal of Vacuum Science Technology*. May/Jun. 1996.

"Passivation of GaAs Using $(Ga_2O_3)_{1-x}(Gd_2O_3)_x$, 0×1.0 films," Kwo et al. *Applied Physics Letters*. Aug. 1999. vol. 75. No. 8.

"Structural Properties of $Ga_2O_3(Gd_2O_3)$–GaAs Interfaces," *Journal of Vacuum Science Technology*. May/Jun. 1998.

"Oxide films grown on GaAs(110) at 20 K: Stability during Cr overlayer formation," Seo et al. *J. Appl. Phys*. Oct. 1991. vol. 70.

"Thermodynamic and photochemical stability of low interface state density $Ga_2O_3$–GaAs structures fabricated by in situ molecular beam epitaxy," Passlack et al. *Appl. Phys. Lett*. Jul. 1996. vol. 69.

"Interface control of Gd2O3/GaAs system using pre–deposition of Gd metal on GaAs substrate with native oxides," Yang et al. *Thin Solid Films*. 2002. vol. 420–421.

* cited by examiner

METHOD OF FABRICATION FOR III-V SEMICONDUCTOR SURFACE PASSIVATION

PRIORITY INFORMATION

This application claims priority, under 35 U.S.C. § 119, from U.S. Provisional Patent Application, Ser. No. 60/351,185, filed on Jan. 22, 2002; the entire contents of U.S. Provisional Patent Application, Ser. No. 60/351,185, are hereby incorporated by reference.

FIELD OF THE PRESENT INVENTION

The present invention is directed to electronic and opto-electronic devices that comprise an oxide layer on III-V based semiconductor material, and methods of making the devices.

BACKGROUND OF THE PRESENT INVENTION

Dielectric coatings play an important role in achieving desired performance of III-V semiconductor opto-electronic devices. Dense, closely packed thin films are required to protect the surface, such as light emitting or receiving facets, of opto-electronic devices from contamination and oxidation. Antireflection coatings (AR) are also required on light emitting or receiving facets to increase the quantum efficiency of opto-electronic devices.

Dielectric thin films providing low midgap interface state density are required, in particular on light emitting facets, to minimize non-radiative energy-dissipating processes such as carrier recombination via interface states. Carrier recombination is known to trigger a process at laser facets called thermal runaway causing device failure especially when operated at high optical power.

Inversion channel field effect devices require dielectric films providing an unpinned Fermi level and low density of interface states below midgap (p-channel device) or above midgap (n-channel device) at the dielectric/semiconductor interface. Further, hysteresis-free, capacitance-voltage characteristics with excellent reproducibility of flatband voltage, small flatband voltage shift, and small frequency dispersion are required.

Also, passivation of states on exposed surfaces of electronic III-V devices requires low density of midgap interface states. A variety of materials have been proposed for such layers including $ZrO_2$, $Al_2O_3$, $SiO_x$, $SiN_x$, $SiN_xO_y$, $Y_2O_3$, stabilized $ZrO_2$, borosilicate glass and gallium oxide. $Al_2O_3$, $SiO_x$, $SiN_x$, $SiN_xO_y$, and borosilicate glass layers are fabricated with dielectric properties, but exhibit a pinned Fermi level near midgap with a midgap state density above $10^{13}$ $cm^{-2}eV^{-1}$ when deposited on bare III-V semiconductor layers. The midgap interface state density is in a range between $7 \times 10^{11}$ $cm^{-2}eV^{-1}$ and $10^{13}$ $cm^{-2}eV^{-1}$ when deposited on GaAs samples previously treated by liquid or dry surface passivation techniques.

It is well known to those skilled in the art that a major shortcoming of GaAs-based semiconductor materials is the typically relatively poor quality and/or instability of the semiconductor/insulator interfaces produced by prior art methods. For instance, there is more difficulty with "native" oxides on GaAs than on InP. The quality of these interfaces is typically substantially less than the quality routinely attained in the Si/SiO, system.

In particular, the quality of GaAs/insulator interfaces typically is insufficient for many device applications, e.g., for GA-based MOSFETs or HBTs. Indeed, there are indications that in GaAs, the Fermi level is pinned even if the surface is atomically clean, requiring unpinning of the Fermi level. By "quality" of the semiconductor/oxide interface it is in reference to such device-relevant parameters as interface state density, interface recombination velocity, and thermochemical and photochemical stability.

Other attempts have been proposed to provide GaAs-based semiconductor/gallium oxide layer structures that yield interfaces of substantially improved quality. For example, it has been proposed in U.S. Pat. No. 5,821,171 to Hong et al. to provide a thin dielectric film on a GaAs-based semiconductor body having a major surface. The thin dielectric film comprises $Ga_2O_3$ fabricated by electron-beam evaporation of a single crystal, high purity $Gd_3Ga_5O_{12}$, complex compound on substrates kept at a temperature within a range of from 40° to 370° C. and in a vacuum at or greater than $1 \times 10^{-10}$ Torr. The major surface is prepared, prior to forming the thin dielectric film upon the major surface, to be substantially atomically clean. The major surface is atomically cleaned using any appropriate technique that results in essentially complete desorption of native oxide and other impurities from the surface.

Although this GaAs-based semiconductor/gallium oxide layer structure may yield interfaces of substantially improved quality, the process of preparing the structures is not particularly commercially feasible due to the requirements of the major surface having to be substantially atomically clean (the desorption of the native oxide layer) prior to forming the dielectric film and the forming of the dielectric layer in a very high vacuum environment.

In view of the advantages potentially available from GaAs-based electronic devices (e.g., FETs, HBTs) and integrated circuits, it would be highly desirable to have available a commercially practical method of making a GaAs-based semiconductor/gallium oxide layer structure that can yield interfaces of substantially improved quality.

SUMMARY OF THE PRESENT INVENTION

A first aspect of the present invention is a method for passivating a surface of a semiconductor structure. The method provides III-V semiconductor material having a surface to be passivated; produces an oxide layer upon the surface of the III-V semiconductor material to be passivated; and deposits, upon the oxide layer, a passivation interlayer of a material having the ability to intermix with the oxide layer so as to exchange oxygen, passivation interlayer material, and III-V semiconductor material therebetween to form graded layers of oxidized III-V and passivation interlayer material.

A second aspect of the present invention is a method for passivating a surface of a semiconductor structure. The method provides III-V semiconductor material having a surface to be passivated; produces an oxide layer upon a portion of the surface of the III-V semiconductor material to be passivated; and deposits, upon the oxide layer, a passivation interlayer of a material having the ability to intermix with the oxide layer so as to exchange oxygen, passivation interlayer material, and III-V semiconductor material therebetween to form graded layers of oxidized III-V and passivation interlayer material.

A third aspect of the present invention is a method for passivating a surface of a semiconductor structure. The method provides III-V semiconductor material having a surface to be passivated; produces an oxide layer upon the surface of the III-V semiconductor material to be passivated; and passivates the surface of the III-V semiconductor material having the oxide layer, without desorption of the oxide layer.

A fourth aspect of the present invention is a method for passivating a surface of a semiconductor structure. The method provides III-V semiconductor material having a surface to be passivated; produces an oxide layer upon the surface of the III-V semiconductor material to be passivated; and passivates the surface of the III-V semiconductor material having the oxide layer, in a vacuum of $2 \times 10^{-6}$ Torr.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
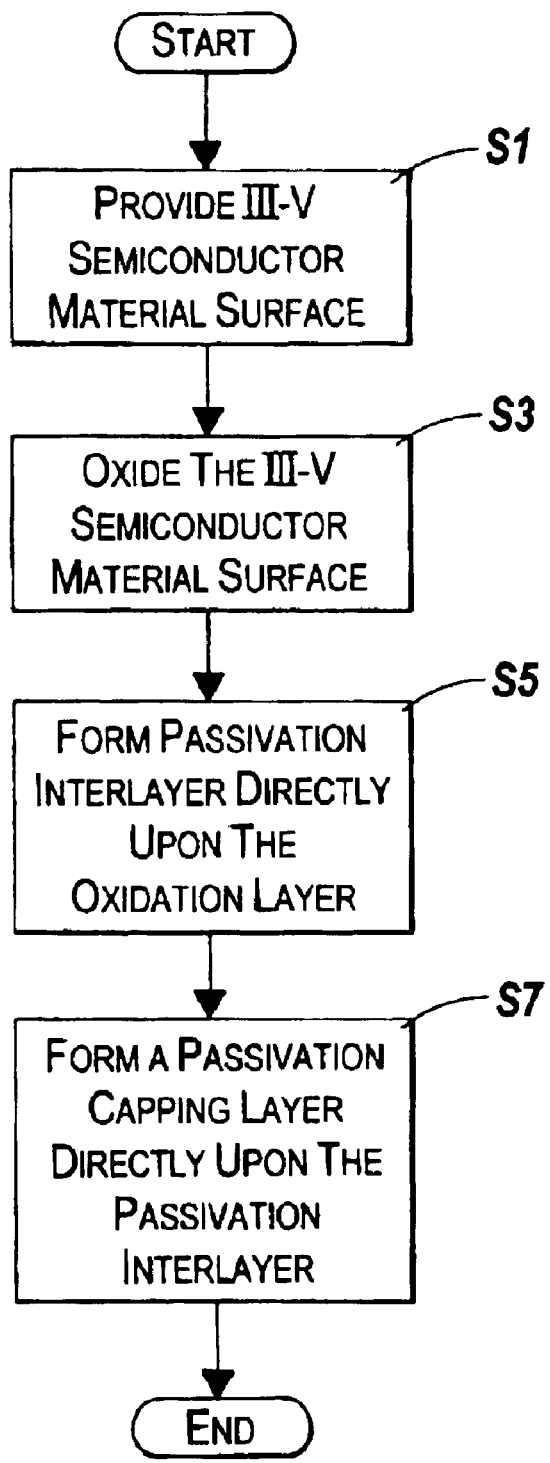
FIG. 1 is a flowchart showing the passivation surface process according to the concepts of the present invention.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

Figure 2:
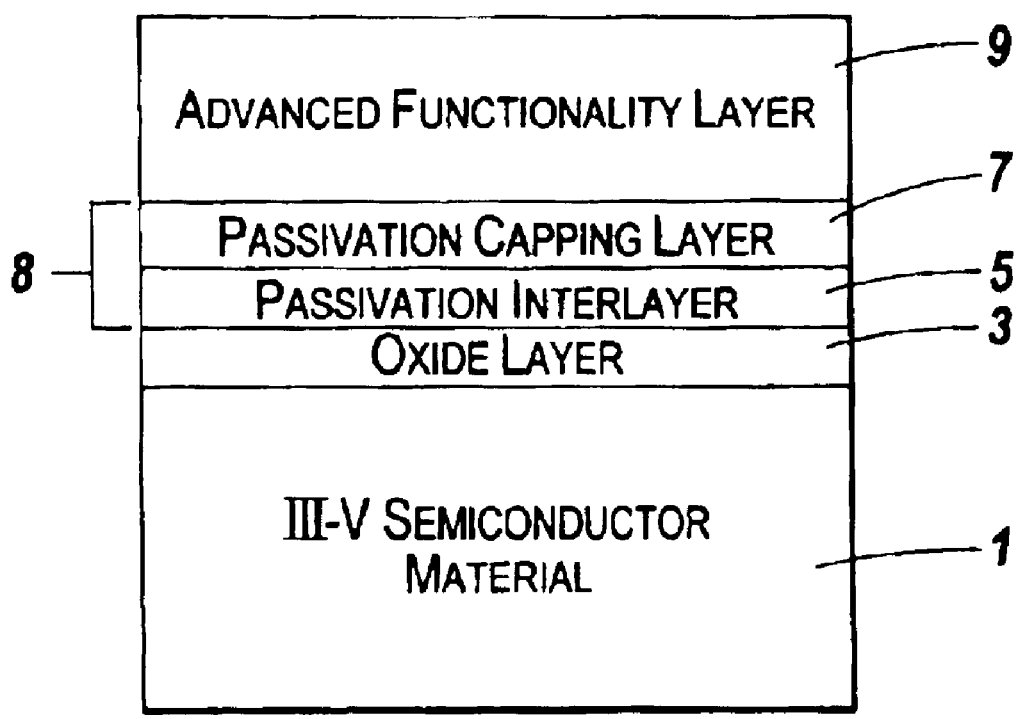
FIG. 2 illustrates a III-V material based semiconductor structure fabricated using the concepts of the present invention.

FIG. 2 illustrates a III-V material based semiconductor structure fabricated using the concepts of the present invention. As illustrated in FIG. 2, a III-V material 1 forms the basis of the semiconductor structure. The III-V material 1 has formed thereupon, an oxide layer 3. Upon the oxide layer 3, a passivation interlayer 5 is formed. The passivation interlayer 5 can be depositied by a variety of techniques. The passivation interlayer 5 is formed of a rare earth metal. In the preferred embodiment of the present invention, the passivation interlayer 5 is formed of gadolinium (Gd). This passivation interlayer 5 is preferably about 25 Å thick.

Upon the passivation interlayer 5, a passivation capping layer 7 is formed. The passivation capping layer 7 is preferably formed by E-beam evaporation, as in the E-beam evaporation of gadolinium gallium garnet (GGG). However, The passivation capping layer 7 can be depositied by a variety of techniques. This passivation capping layer 7 has a thickness between 3.0 nm and 100 nm. In the preferred embodiment of the present invention, passivation capping layer 7 has a thickness of about 20 nm. It is noted that passivation interlayer 5 and passivation capping layer 7 form, together, a passivation layer 8. Furthermore an advanced functionality layer or layers 9 may be added for custom applications such as the formation of an anti-reflection coating. The advanced functionality layer or layers 9 can be deposited by a variety of techniques.

This III-V semiconductor structure with surface passivation was formed according to the concepts of the present invention as will be described in more detail below.

More specifically, the present invention provides a fabrication method or process that enables III-V semiconductor surface passivation, i.e., production of a substantially electrically insulating surface layer, on a selected III-V material surface without requiring a substantially atomically clean surface or be performed in a very high vacuum environment. Examples of such III-V material surfaces that are particularly well-addressed by the present invention include, but are not limited to, surfaces for optical devices, such as a laser facet surface or a light emitting device surface; and further including surfaces for electronic devices, such as a transistor surface.

The passivation layer (8 of FIG. 2) of the present invention can be employed as the gate oxide in a III-V field effect device and/or can be employed for reducing field effect transistor channel depletion and minimization of interface scattering caused by an abrupt termination of a III-V crystal material at the material surface.

The surface passivation fabrication method or process of the present invention is convenient, requires only standard semiconductor equipment, and produces a passivation layer (8 of FIG. 2) having characteristics comparable to that of passivation layers produced by much more complicated fabrication processes.

In the fabrication process provided by the present invention, as illustrated in FIG. 1, a III-V surface to be passivated is produced, at step S1, in any suitable manner, e.g., by epitaxial growth or deposition, or provided as an exposed surface of a bulk structure or material. The III-V surface on which passivation is to be provided is then exposed to conditions that produce an oxide layer on that surface, at step S2.

It is recognized that for some applications it can be desired to passivate a region of a surface, rather than an entire surface. In such a scenario, the surface regions not to be passivated can be masked from this oxidation, if desired. Additionally, the oxide layer can be formed after partial processing of the III-V surface. For example, metallic surface contacts can be deposited on the III-V surface and annealed prior to oxidation of the surface. Other surface as well as bulk microfabrication processes can also be carried out prior to the surface oxidation step.

The oxide layer (3 of FIG. 2) can be produced as a native oxide layer resulting from exposure of the selected surface or surface region to ambient or other selected conditions, or can be a formed layer, e.g., a deposited or grown oxide layer. It is noted that the production of the oxidation layer (3 of FIG. 2), according to the concepts of the present invention, is not limited to a particular oxidation technique, instead requiring only that the particular oxide composition and deposition or growth method be compatible with the underlying III-V surface to be passivated and be compatible with any passivation capping layers to be subsequently produced in the manner described below. If desired, a blanket oxide layer can be formed and then lithographically patterned and etched to define a surface region to be passivated, or can be selectively grown or deposited only on selected surface regions.

The oxide layer (3 of FIG. 2) is preferably at least several monolayers thick, and preferably is not more than several hundred monolayers thick. It is to be recognized that the thickness of the oxide layer is preferably selected based on the particular III-V surface material to be passivated; as explained in detail below, it is understood that the oxide layer interacts with the underlying III-V surface layer and the thickness of the oxide layer may impact the nature of this interaction.

If the oxide layer (3 of FIG. 2) is selected to be a native oxide produced by exposure of the III-V surface to be ambient conditions, then for most III-V materials the oxide layer thickness is automatically determined by the self-limiting nature of oxide growth on a III-V material.

For example, after about an hour of ambient exposure at room temperature, a III-V material such as GaN is found to exhibit a native surface oxide layer of a thickness between about 20 Å–30 Å. This native oxide layer does not substantially increase in thickness during subsequent additional ambient exposure of the oxidized surface. As a result, for most III-V materials, the thickness of an oxide layer provided as a native oxide layer is automatically determined by the nature of the native oxidation process.

The oxide layer to be provided on the III-V semiconductor surface can also be a combination of native and/or deposited or grown oxides, in any suitable composition and thickness configuration that is optimal for a given application. The oxide layer (3 of FIG. 2) can further be provided as a device layer that is deposited or grown on the selected semiconductor surface as well as other surfaces or surface regions in the course of fabrication of bulk or surface devices or structures on the III-V surface of interest or other surfaces.

Then in step S5, onto the oxide layer surface is deposited a passivation layer (8 of FIG. 2) of materials selected based on the criteria given below for producing the passivation layer.

In one example, employing GaN as a III-V surface material, the passivation interlayer (5 of FIG. 2) can be provided as, e.g., a layer of gadolinium (Gd).

Before forming the passivation interlayer (5 of FIG. 2), it may be preferable, although not required, the oxidized III-V surface is cleaned using any cleaning technique that is compatible with the III-V surface material and the oxide layer. No particular or specialized cleaning process is required by the present invention.

In contrast to conventional wisdom, the present invention does not require desorption of the oxide layer (3 of FIG. 2) prior to the passivation interlayer deposition. Instead, in accordance with the present invention, the passivation interlayer (5 of FIG. 2) is produced directly on the oxidized layer (3 of FIG. 2) atop the III-V surface material (1 of FIG. 2). No particular precautions need be followed prior to the passivation interlayer formation to limit the oxidized III-V surface exposure to ambient conditions; the oxide layer can be exposed to ambient conditions prior to the passivation interlayer deposition. Thus, ex situ, as well as in situ, passivation interlayer formation techniques are contemplated by the present invention.

The passivation interlayer (5 of FIG. 2) preferably is composed of a material or materials that can be oxidized, that is compatible with all of the III-V material and the lower oxide layer, and that is compatible with the passivation capping layer (7 of FIG. 2), if such is included in the manner described below.

In the description of the present invention, "compatible" is meant as an ability of the passivation interlayer to at least partially intermix with the oxidized III-V surface. Such intermixing is understood to involve the exchange of oxygen, the passivation interlayer material, and the underlying III-V surface material to form graded layers of oxidized III-V and passivation interlayer materials.

It is understood in accordance with the present invention that a wide range of intermixed passivation interlayer oxide concentrations are adequate for producing effective surface passivation, and thus a wide range of materials can be suitable in the selection of passivation interlayer material. The passivation interlayer (5 of FIG. 2) is preferably of a thickness of between about 5 Å and about 200 Å. As noted above, in the preferred embodiment of the present invention, the passivation interlayer (5 of FIG. 2) is about 25 Å. It is contemplated by the present invention, however, that the passivation interlayer (5 of FIG. 2) thickness preferably be adjusted based on the selected III-V surface material to optimize the intermixing of surface layers in the manner just described.

The passivation interlayer deposition can be carried out by, e.g., sputtering, chemical vapor deposition, plasma deposition, E-beam evaporation, or other selected deposition technique that is compatible with the underlying oxide layer. For example, a Gd passivation interlayer can be deposited by conventional E-beam evaporation at a relatively low background pressure, e.g., between about $4 \times 10^{-7}$ and about $2 \times 10^{-6}$ Torr.

Whatever passivation interlayer formation technique is employed, it preferably is carried out at a temperature that is well below the melting point or sublimation temperature of the III-V material. It is found that even at such relatively low temperatures the passivation process of the present invention is effective.

For example, as described below, GaN surfaces can be successfully passivated by employing a passivation interlayer deposition temperature that maintains the underlying substrate at a temperature of about 150° C. Additionally, InGaAs/AlGaAs laser facets can be successfully passivated by employing room temperature deposition of the passivating interlayers. It is therefore preferred in accordance with the present invention that the specific passivation interlayer formation process parameters be optimized for a given III-V material surface being passivated.

At step S7, a passivation capping layer (7 of FIG. 2) is deposited on the passivation interlayer (5 of FIG. 2). The passivation capping layer deposition can be carried out by, e.g., sputtering, chemical vapor deposition, plasma deposition, E-beam evaporation, or other selected deposition technique that is compatible with the underlying layer. It is noted that step S7 is preferred, but this process step is not required by the present invention.

The composition of the passivation capping layer (7 of FIG. 2) is selected to be compatible with the passivation interlayer (5 of FIG. 2) composition and the oxide layer (3 of FIG. 2) composition so that the passivation capping layer (7 of FIG. 2) can at least partially intermix with the passivation interlayer (5 of FIG. 2) and oxidized III-V surface material if desired.

This passivation capping layer (7 of FIG. 2) may not be required for all applications in that it is understood that an intermixing of the passivation interlayer (5 of FIG. 2) and the oxidized III-V surface material (3 of FIG. 2) is the only strict requirement for successful passivation. However, if a passivation capping layer (7 of FIG. 2) that is mixable with the lower layers is employed, the passivation process can be rendered more robust in its accommodation of a wider range of parameters in the processing of the lower layers.

The present invention does not require a particular passivation capping layer composition; all that is required for large process latitude is an at least partial intermixing compatibility of the three layers as defined above. For example, the passivation capping layer can be provided as $Ga_2O_3(Gd_2O_3)$, given a Gd passivation interlayer, it is known that $Ga_2O_3(Gd_2O_3)$ is intermixable with Gd and a native GaN oxide.

In addition to the requirement of intermixability of the passivation capping layer, it further is preferred that the passivation capping layer material exhibit characteristics typical of a stable dielectric capping layer that is compatible with device fabrication and operational performance objectives. The passivation capping layer can be provided as a selected oxide or dielectric layer or other selected layer or combination of layers that are found to be stable with the underlying layers.

As noted above, the passivation capping layer can be, preferably, formed by E-beam evaporation, as in the E-beam evaporation of gadolinium gallium garnet (GGG). Preferably, the passivation capping layer is deposited on the passivation interlayer surface in situ, i.e., in the passivation interlayer deposition chamber. In one preferred scenario, an in situ change of evaporation source crucibles is carried out after passivation interlayer deposition in the vacuum chamber, without breaking vacuum, to enable such in situ deposition of the passivation capping layer immediately following deposition of the passivation interlayer. While this in situ scenario is preferred, it is not required; ex situ deposition the passivation capping layer can also be carried out.

Whatever technique is employed, the passivation capping layer formation is preferably carried out at a III-V surface material temperature that is compatible with device fabrication procedures for the materials involved. For example, as described below, passivation of GaN surfaces can be carried out successfully by employing a passivation capping layer deposition temperature of about 150° C.

Surface passivation of InGaAs/AlGaAs surfaces can be carried out successfully by employing a passivation capping layer deposition temperature of between about room temperature and about 40° C. Such temperatures enable implementation of the passivation process at any point in a device fabrication sequence, including points after contacts have been formed.

The passivation capping layer is preferably provided with a thickness that is sufficient for enabling robust passivation of the surface material as a device capping layer. An example range of passivation capping layer thickness is between about 3.0 nm and 100 nm.

If pinhole-free coverage of the passivation interlayer by the passivation capping layer material is achieved, the passivation capping layer need not be overly thick and could be, for example, about 10 nm thick for many applications.

Furthermore, a relatively thicker passivation capping layer can be undesirable for some applications. For example, when the passivation of the present invention is employed as the gate dielectric in a field effect device, a thicker layer will result in a larger voltage drop across the layer, between an upper gate layer and the lower semiconductor substrate, thereby reducing the sensitivity of the device.

The passivation capping layer thickness is therefore preferably selected based on device capping and operational considerations.

With respect to forming the optional passivation capping layer, according to the concepts of the present invention, pressure, temperature, and duration of the passivation capping layer formation process are selected such that at the completion of the passivation capping layer formation, intermixing of the lower oxidized III-V surface material and the passivation interlayer has occurred, with at least partial intermixing of the passivation capping layer optionally occurring, resulting in formation of a passivation layer (8 of FIG. 2) having the requisite mechanical capping and electrical insulation characteristics.

Alternatively, with respect to forming the optional passivation capping layer, according to the concepts of the present invention, the present invention contemplates the employment of additional processing steps or single step carried out to activate or to enhance, the layer intermixing, specifically, for enabling and/or enhancing the interdiffusion of the passivation interlayer.

For example, a conventional annealing or rapid thermal annealing step can be carried out once the passivation capping layer is formed to activate or enhance layer intermixing. The temperature and duration of any annealing step to be completed are preferably selected based on the level of processing and device configuration existing at the time of the passivation sequence. As with the material deposition steps described above, any post-processing annealing steps preferably are carried out at temperatures below the melting and sublimation temperatures of the materials present at that point in the fabrication sequence Once the oxide layer 3 and passivation layer 8 have been applied and processed an advanced functionality layer or layers 9 may be applied using standard processing techniques. For example such a layer could be applied to serve as either an anti-reflection or high-reflection coating in an opto-electronic application.

Examples of the application of the passivation process of the present invention to various devices will be discussed below.

In a first example, the passivation process of the present invention is carried out upon a GaN surface to produce MOS diodes and MOSFET's. In this example, the GaN surface is produced by HVPE on sapphire substrates. A native oxide layer is then produced on the GaN by exposure of the GaN surface to ambient conditions for many hours.

Furthermore, in this example, a passivation interlayer (5 of FIG. 2) of Gd is then formed on the oxide by E-beam evaporation of a chunk Gd source. A passivation capping layer (7 of FIG. 2) of $Ga_2O_3/Gd_2O_3$ is then formed on the Gd passivation interlayer, also by E-beam evaporation, employing a gadolinium gallium garnet (GGG) source.

It is recognized that the stoichiometry of a GGG source changes with use, causing a shift in the amount of $Gd_2O_3$ incorporated into the passivation capping layer, but this shift is not critical to the process of the present invention.

According to the concepts of the present invention, a relatively low vacuum of $2\times10^{-6}$ Torr is employed in a multi-hearth electron beam evaporator for in situ deposition of both the passivation interlayer and the passivation capping layer.

Using the process of the present invention, a matrix of MOS diodes can be fabricated on $4.3\times10^{17}$ cm$^{-3}$ and $4.0\times10^{16}$ cm$^{-3}$ n-type GaN layers. Top metal contacts consisting of 5.0 nm-thick layer of Pt/a 25.0 nm-thick layer of Ti/a 30.0 nm-thick layer of Pt/and a 300.0 nm-thick layer of Au, can be evaporated onto each of the samples using either a stencil mask or a standard photoresist liftoff technique. The ohmic contacts can be made to the GaN material by annealing indium dots into the sample. The process matrix consists of the following:

| Gd thickness | Ga$_2$O$_3$/Gd$_2$O$_3$ thickness | SiO$_2$ thickness | Contact w/no passivation | Substrate Temperature |
|---|---|---|---|---|
| 2.5 nm | 20.0 nm | 0 | NO | 150° C. |
| 2.5 nm | 40.0 nm | 0 | NO | 150° C. |
| 0 | 20.0 nm | 0 | NO | 150° C. |
| 2.5 nm | 20.0 nm | 0 | NO | Room temp |
| 0 | 0 | 20.0 | NO | Room temp |
| 0 | 20.0 | 0 | NO | Room temp |
| 0 | 0 | 0 | YES | Room temp |

Current voltage (I-V) measurements of the samples produced in accordance with the matrix above demonstrated several interesting results. The sample for which a metal contact was produced directly on the GaN layer, to form a Schottky barrier configuration, and the sample for which a contact was formed on a SiO$_2$ layer demonstrated very similar characteristics, each with a reverse breakdown voltage of about 100 volts. In forward bias, the sample having a metal contact provided on a SiO$_2$ layer broke down easily while the Schottky metal contact device was more robust.

It is further noted that for the two samples in which only a Ga$_2$O$_3$/Gd$_2$O$_3$ layer is provided under the contact, deposition substrate temperature has no impact on device performance; both the room temperature and the 150° C. deposition temperature for Ga$_2$O$_3$/Gd$_2$O$_3$ samples exhibit very poor reverse break down voltages as well as poor forward bias characteristics. The samples for which room temperature deposition of both Gd and Ga$_2$O$_3$/Gd$_2$O$_3$ layers was employed also exhibit poor reverse break down characteristics.

The samples for which both Gd and Ga$_2$O$_3$/Gd$_2$O$_3$ layers were provided at a deposition substrate temperature of 150° C., however, exhibit very good reverse bias breakdown characteristics and adequate forward bias knees.

Capacitance-voltage (C-V) measurements were also taken on all of the sample devices. Good quality MOS behavior was observed in all of the sample devices that included layers of both Gd and Ga$_2$O$_3$/Gd$_2$O$_3$ and a deposition substrate temperature of about 150° C. In the matrix, for all the samples, the Gd layer was about 2.5 nm-thick.

In another example, MOSFETs are fabricated on GaN material by providing, under the gates of the devices, a 2.5 nm-thick Gd layer. In this example, a 20.0 nm-thick Ga$_2$O$_3$/Gd$_2$O$_3$ layers improve device performance substantially over devices having a Schottky metal gate directly on the GaN channel in a MEFSFET configuration. It is noted that a post-deposition rapid thermal anneal at a temperature of 900° C. for 30 second aids the Gd/GGG passivation process.

In testing the Gd/Ga$_2$O$_3$/Gd$_2$O$_3$ device fabricated using the concepts of the present invention as discussed above, it was found that the Gd/Ga$_2$O$_3$/Gd$_2$O$_3$ device performed better than a Schottky device. The Gd/Ga$_2$O$_3$/Gd$_2$O$_3$ device fabricated using the concepts of the present invention as discussed above exhibited reverse breakdown voltages that were 2× to 3× that of the Schottky device. Furthermore, the Gd/Ga$_2$O$_3$/Gd$_2$O$_3$ device fabricated using the concepts of the present invention as discussed above could be pinched off while the Schottky device could not be pinched off.

It is noted in accordance with the present invention that the surface passivation process of the present invention can also be particularly advantageous for the passivation of laser facets.

In another example of utilizing the fabrication process of the present invention, the deposition of a 2.5 nm-thick Gd film on an oxidized GaAs/AlGaAs laser facet, followed by the deposition of a 20.0 nm-thick Ga$_2$O$_3$/Gd$_2$O$_3$ film was carried out. The layers were deposited on both facets of the laser at room temperature and without breaking system vacuum. Pulsed optical output measurements indicated that the Gd/Ga$_2$O$_3$/Gd$_2$O$_3$ coated devices produced 2× to 3× the optical output power, before catastrophic failure, as compared to uncoated devices.

As noted above, the surface passivation process of the present invention can be utilized in connection and can be particularly advantageous for the passivation of laser facets that are prone to catastrophic optical damage (COD). This advantage can be seen in FIG. 3.

Figure 3:
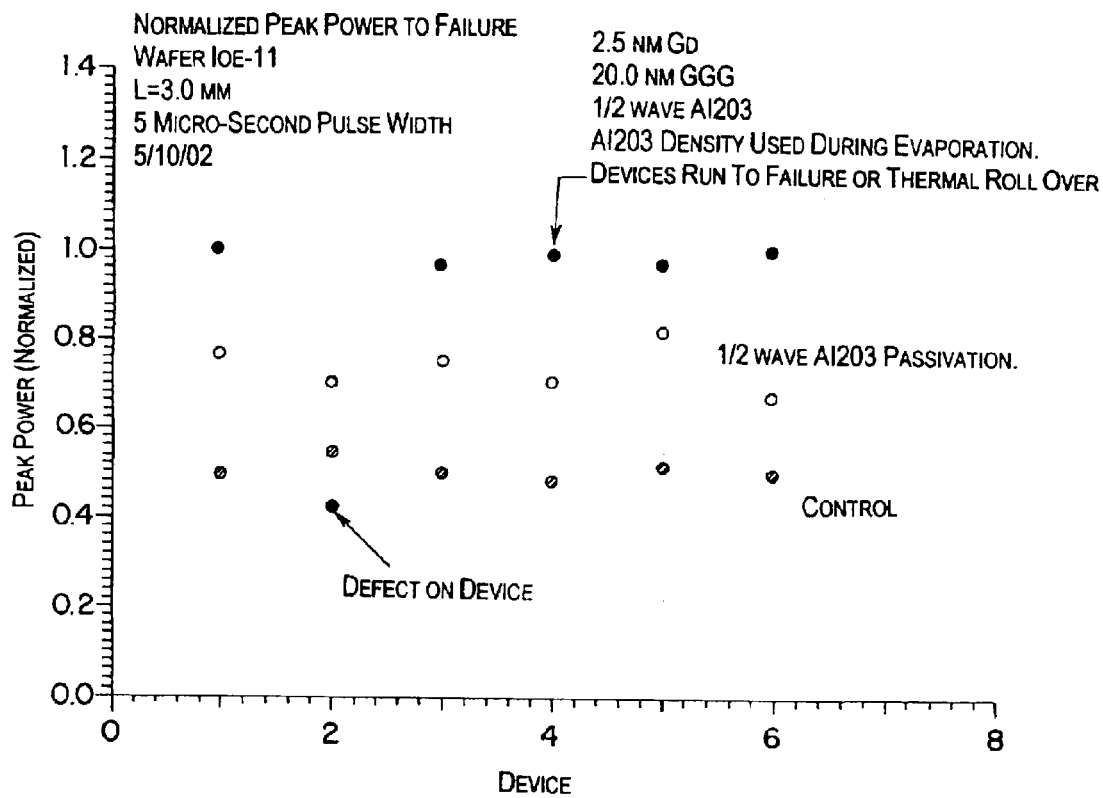
FIG. 3 graphically illustrates pulsed output power at the point of facet catastrophic optical damage for slab-coupled optical waveguide lasers fabricated with no facet passivation, ½ wave $Al_2O_3$ passivation, or $Gd/(Ga_2O_3/Gd_2O_3)$ passivation; an FIG. 4 is a cross section view of an exemplary slab-coupled optical waveguide laser structure for moderately low loss coefficient.

FIG. 3 shows the pulsed powers achieved with uncoated control laser facets, ½ wave Al$_2$O$_3$ coated facets and a 2.5 nm-thick Gd film on an oxidized facet followed by a 20.0 nm-thick Ga$_2$O$_3$/Gd$_2$O$_3$ film in accordance with the fabrication process of the present invention. In these examples, the layers were deposited at room temperature and without breaking system vacuum.

It is noted that FIG. 3 shows that the Gd/(Ga2O3/Gd$_2$O$_3$) coated devices produced about 2× the optical output power, before catastrophic optical damage, as compared to the uncoated devices and about 1.25× as compared to ½ wave Al$_2$O$_3$ coatings. Similar results are also realized when devices are operated continuous wave.

Figure 4:
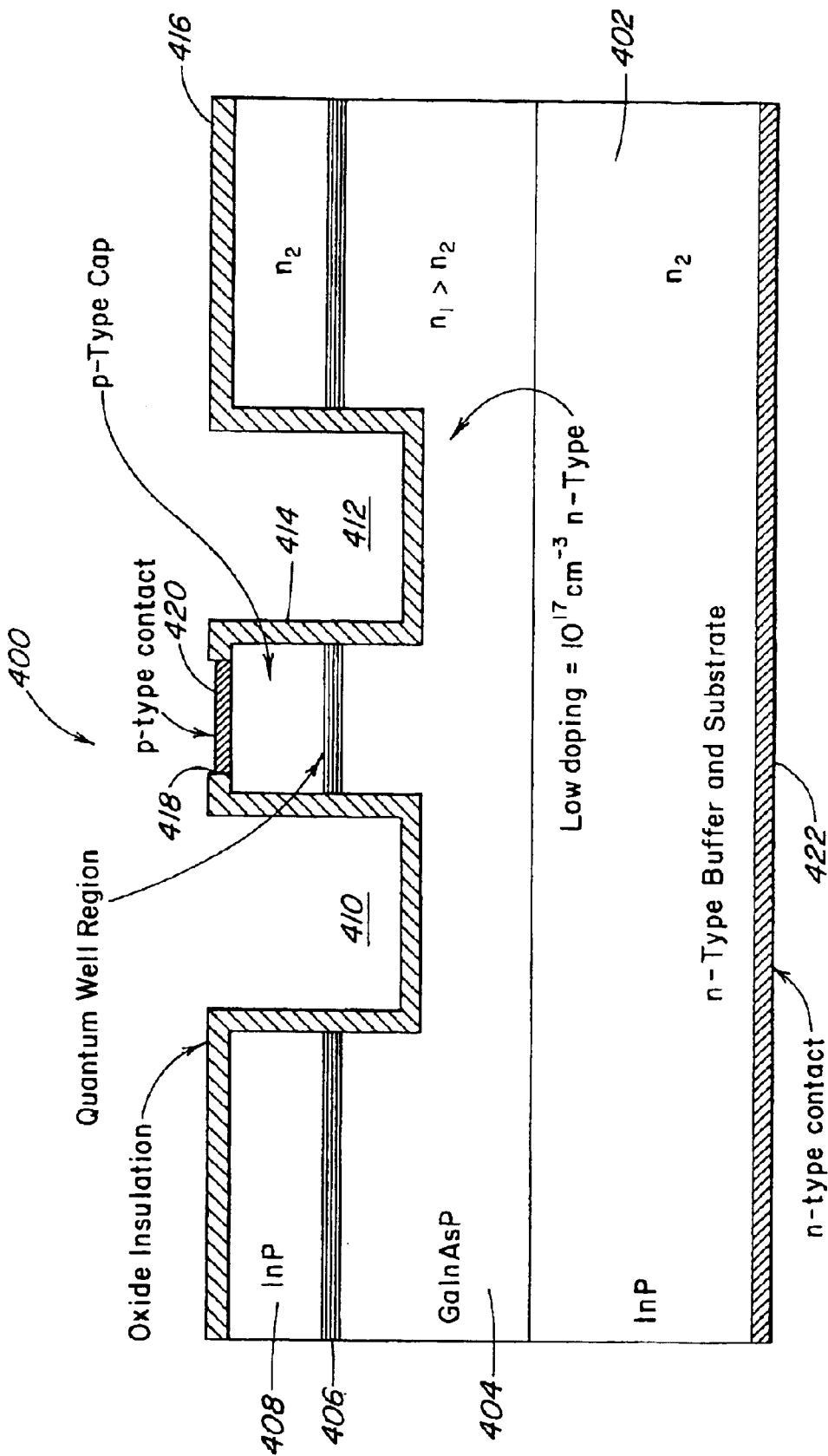

In another example, an AlGaAs/InGaAs slab-coupled optical waveguide laser (SCOWL), as illustrated in FIG. 4, is fabricated using the surface passivation process of the present invention.

FIG. 4 is a cross section view of an exemplary SCOWL structure 400 for moderately low loss coefficient. Specifically, fabrication in the GaInAsP/InP material system for laser operation near 1.3-μm wavelength is described.

Initially, a GaInAsP layer 404 is provided on a n-type buffer and substrate (InP) 402. Thereafter, a quantum well region 406 and a p-type InP cap layer 408 are subsequently fabricated. Grooves 410 and 412 are configured by etching or other conventional manner, thus forming a ridge structure 414. Finally, a thin oxide insulation layer 416 covers the entire surface except for an opening area 418 on the ridge surface in which the metal contact 420 to the p-type material is made. The metal contact 422 to the n-type material is made on the backside of the substrate.

A more detailed description of this slab-coupled optical waveguide laser is set forth in co-pending U.S. patent application Ser. No. 09/903,099, filed on Jul. 11, 2001 and entitled "Slab-Coupled Optical Waveguide Laser And Amplifier." The entire contents of co-pending U.S. patent application Ser. No. 09/903,099 are hereby incorporated by reference.

In this example, to increase the output power at which catastrophic optical damage occurs, the slab-coupled optical waveguide laser is subjected to the passivation procedures of the present invention. In this process, passivation of the facets is carried out as soon as possible after cleaving and deposition of a 25-Å thick layer of gadolinium and a 200-Å thick layer of gadolinium-gallium-garnet (GGG) before the final facet coatings.

The output power at catastrophic optical damage of a slab-coupled optical waveguide laser with the coating procedure of the present invention was about 1.5–2 times greater than that of a slab-coupled optical waveguide laser with nominal half-wavelength (λ/2) Al$_2$O$_3$ coatings for passivation on the cleaved facets. A continuous wave output power of 0.85 W out of the front facet was realized before catastrophic optical damage occurred. Moreover, the threshold in the slab-coupled optical waveguide laser with the coating procedure of the present invention is reduced to about 0.25 A due to the facet coatings.

Although it is difficult to directly calculate the threshold of catastrophic optical damage in the slab-coupled optical waveguide laser devices because of their unique geometry, the catastrophic optical damage's of the Gd/($Ga_2O_3$/$Gd_2O_3$) coated devices are approximately calculated from measured peak powers to be about 18.5 MW/cm² for devices running continuous wave. Catastrophic optical damage's for some of the best traditional AlGaAs/InGaAs laser structures with proprietary facet coatings are of the order of 19.4 MW/cm² to 30 MW/cm². Thus, the catastrophic optical damage levels achieved with the Gd/($Ga_2O_3$/$Gd_2O_3$) passivation technique of the present invention compare well with those achieved with other more complicated techniques. Similar results are expected when Gd/($Ga_2O_3$/$Gd_2O_3$) coatings are applied to the facets of other III-V diode and optically pumped lasers, and in particular, InGaAlSb based devices.

The passivation process of the present invention is understood to be generally applicable to all III-V semiconductors. The results discussed above for GaN and GaAs/AlGaAs demonstrate the applicability of the passivation technique for III-V semiconductor electronic and photonic devices. It is to be recognized that as with most microfabrication processes some minor adjustments may be required of the process for specific materials. Such adjustments can include, e.g., determining a preferred substrate temperature for layer deposition for a given III-V semiconductor, and the possible need to post-process anneal the layers to activate, enhance, and/or optimize their intermixing.

The advantages of the passivation process of the present invention are clear: the process can be implemented with conventional microfabrication equipment and standard fabrication practices and yet produce device quality conventionally thought to be produced only by much more complicated and costly processes. The process of the present invention can be easily scalable for high throughput, and therefore is efficient and cost-effective for commercial manufacturing scenarios. The passivation process of the present invention can be carried out on substrates that have been partially processed, and can employ standard techniques to be used in the course of a conventional microfabrication sequence. Given this elegance and the straightforward techniques of the process of the present invention, the present invention contemplates its application to a wide variety of III-V devices, including high temperature GaN electronic devices, InP and GaAs electronic and optoelectronic devices, and other III-V optical and electrical devices and systems.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A method for passivating a surface of a semiconductor structure, comprising:
   (a) providing III-V semiconductor material having a surface to be passivated;
   (b) producing an oxide layer upon the surface of the III-V semiconductor material to be passivated;
   (c) depositing, upon the oxide layer, a passivation interlayer of a material having the ability to intermix with the oxide layer so as to exchange oxygen, passivation interlayer material, and III-V semiconductor material therebetween to form graded layers of oxidized III-V and passivation interlayer material; and
   (d) depositing, upon the passivation interlayer, a passivation capping layer of a material having the ability to intermix with the oxide layer and passivation interlayer so as to exchange oxygen, passivation interlayer material, passivation capping layer material, and III-V semiconductor material therebetween to form graded layers of oxidized III-V, passivation interlayer material, and passivation capping layer material, the passivation capping layer material comprising $Ga_2O_3$($Gd_2O_3$).

2. The method as claimed in claim 1, wherein the passivation capping layer is formed by electron beam evaporation of gadolinium gallium garnet.

3. The method as claimed in claim 1, wherein metallic surface contacts are deposited on the surface of the III-V semiconductor material to be passivated and annealed prior the producing of the oxide layer on the surface of the III-V semiconductor material to be passivated.

4. The method as claimed in claim 1, wherein the oxide layer is produced as a native oxide layer from exposing the surface of the III-V semiconductor material to be passivated to ambient conditions.

5. The method as claimed in claim 1, further comprising:
   (e) depositing, upon the passivation capping layer, an advanced functionality layer.

6. The method as claimed in claim 1, further comprising:
   (e) depositing, upon the passivation capping layer, an anti-reflection coating.

7. The method as claimed in claim 1, further comprising:
   (e) depositing, upon the passivation capping layer, a high-reflection coating.

8. A method for passivating a surface of a semiconductor structure, comprising:
   (a) providing III-V semiconductor material having a surface to be passivated;
   (b) producing an oxide layer upon a portion of the surface of the III-V semiconductor material to be passivated;
   (c) depositing, upon the oxide layer, a passivation interlayer a material having the ability to intermix with the oxide layer so as to exchange oxygen, passivation interlayer material, and III-V semiconductor material therebetween to form graded layers of oxidized III-V and passivation interlayer material; and
   (d) depositing, upon the passivation interlayer, a passivation capping layer of a material having the ability to intermix with the oxide layer and passivation interlayer so as to exchange oxygen, passivation interlayer material, passivation capping layer material, and III-V semiconductor material therebetween to form graded layers of oxidized III-V, passivation interlayer material, and passivation capping layer material, the passivation capping layer material comprising $Ga_2O_3$($Gd_2O_3$).

9. The method as claimed in claim 8, wherein the passivation capping layer is formed by electron beam evaporation of gadolinium gallium garnet.

10. The method as claimed in claim 8, wherein the oxide layer is produced as a native oxide layer from exposing the surface of the III-V semiconductor material to be passivated to ambient conditions.

11. The method as claimed in claim 8, further comprising:
    (e) depositing, upon the passivation capping layer, an advanced functionality layer.

12. The method as claimed in claim 8, further comprising:
   (e) depositing, upon the passivation capping layer, an anti-reflection coating.
13. The method as claimed in claim 8, further comprising:
   (e) depositing, upon the passivation capping layer, a high-reflection coating.
14. A method for passivating a surface of a semiconductor structure, comprising:
   (a) providing III-V semiconductor material having a surface to be passivated;
   (b) producing an oxide layer upon the surface of the III-V semiconductor material to be passivated; and
   (c) passivating the surface of the III-V semiconductor material having the oxide layer, in a vacuum of $2 \times 10^{-6}$ Torr.
15. The method as claimed in claim 14, wherein passivating the surface of the III-V semiconductor material having the oxide layer comprises:
   (c1) depositing, upon the oxide layer, a passivation interlayer of a material having the ability to intermix with the oxide layer so as to exchange oxygen, passivation interlayer material, and III-V semiconductor material therebetween to form graded layers of oxidized III-V and passivation interlayer material.
16. The method as claimed in claim 14, wherein passivating the surface of the III-V semiconductor material having the oxide layer comprises:
   (c1) depositing, upon the oxide layer, a passivation interlayer of a material having the ability to intermix with the oxide layer so as to exchange oxygen, passivation interlayer material, and III-V semiconductor material therebetween to form graded layers of oxidized III-V and passivation interlayer material; and
   (c2) depositing, upon the passivation interlayer, a passivation capping layer of a material having the ability to intermix with the oxide layer and passivation interlayer so as to exchange oxygen, passivation interlayer material, passivation capping layer material, and III-V semiconductor material therebetween to form graded layers of oxidized III-V, passivation interlayer material, and passivation capping layer material.
17. The method as claimed in claim 16, wherein the passivation interlayer material comprises gadolinium.
18. The method as claimed in claim 16, wherein the passivation capping layer material comprises $Ga_2O_3(Gd_2O_3)$.
19. The method as claimed in claim 16, wherein the passivation capping layer is formed by electron beam evaporation of gadolinium gallium garnet.
20. The method as claimed in claim 16, further comprising:
   (d) depositing, upon the passivation capping layer, an advanced functionality layer.
21. The method as claimed in claim 16, further comprising:
   (d) depositing, upon the passivation capping layer, an anti-reflection coating.
22. The method as claimed in claim 16, further comprising:
   (d) depositing, upon the passivation capping layer, a high-reflection coating.
23. A method for passivating an InGaAs surface, comprising:
   (a) providing an InGaAs surface to be passivated;
   (b) producing an oxide layer upon the InGaAs surface to be passivated;
   (c) depositing, upon the oxide layer, a passivation interlayer of a material having the ability to intermix with the oxide layer so as to exchange oxygen, passivation interlayer material, and InGaAs therebetween to form graded layers of oxidized InGaAs and passivation interlayer material; and
   (d) depositing, upon the passivation interlayer, a passivation capping layer of a material having the ability to intermix with the oxide layer and passivation interlayer so as to exchange oxygen, passivation interlayer material, passivation capping layer material, and InGaAs therebetween to form graded layers of oxidized InGaAs, passivation interlayer material, and passivation capping layer material, the passivation capping layer material comprising $Ga_2O_3(Gd_2O_3)$.
24. A method for passivating an AlGaAs surface, comprising:
   (a) providing an AlGaAs surface to be passivated;
   (b) producing an oxide layer upon the AlGaAs surface to be passivated;
   (c) depositing, upon the oxide layer, a passivation interlayer of a material having the ability to intermix with the oxide layer so as to exchange oxygen, passivation interlayer material, and InGaAs therebetween to form graded layers of oxidized AlGaAs and passivation interlayer material; and
   (d) depositing, upon the passivation interlayer, a passivation capping layer of a material having the ability to intermix with the oxide layer and passivation interlayer so as to exchange oxygen, passivation interlayer material, passivation capping layer material, and InGaAs therebetween to form graded layers of oxidized AlGaAs, passivation interlayer material, and passivation capping layer material, the passivation capping layer material comprising $Ga_2O_3(Gd_2O_3)$.
25. A method for passivating a laser facet surface, comprising:
   (a) providing a laser facet surface to be passivated;
   (b) producing an oxide layer upon the laser facet surface to be passivated;
   (c) depositing, upon the oxide layer, a passivation interlayer of a material having the ability to intermix with the oxide layer so as to exchange oxygen, passivation interlayer material, and material of the laser facet therebetween to form graded layers of oxidized material of the laser facet and passivation interlayer material; and
   (d) depositing, upon the passivation interlayer, a passivation capping layer of a material having the ability to intermix with the oxide layer and passivation interlayer so as to exchange oxygen, passivation interlayer material, passivation capping layer material, and material of the laser facet therebetween to form graded layers of oxidized material of the laser facet, passivation interlayer material, and passivation capping layer material, the passivation capping layer material comprising $Ga_2O_3(Gd_2O_3)$.
26. A method for passivating an InGaAlSb surface, comprising:
   (a) providing an InGaAlSb surface to be passivated;
   (b) producing an oxide layer upon the InGaAlSb surface to be passivated;
   (c) depositing, upon the oxide layer, a passivation interlayer of a material having the ability to intermix with the oxide layer so as to exchange oxygen, passivation interlayer material, and InGaAlSb therebetween to form graded layers of oxidized InGaAlSb and passivation interlayer material; and (d) depositing, upon the passivation interlayer, a passivation capping layer of a material having the ability to intermix with the oxide layer and passivation interlayer so as to exchange oxygen, passivation interlayer material, passivation capping layer material, and InGaAlSb therebetween to form graded layers of oxidized material of the laser facet, passivation interlayer material, and passivation capping layer material, the passivation capping layer material comprising $Ga_2O_3$ $(Gd_2O_3)$.

27. A method for passivating an AlGaAs/InGaAs slab-coupled optical waveguide laser comprising:

(a) providing a facet surface of the AlGaAs/InGaAs slab-coupled optical waveguide laser to be passivated;

(b) producing an oxide layer upon the facet surface to be passivated;

(c) depositing, upon the oxide layer, a passivation interlayer of a material having the ability to intermix with the oxide layer so as to exchange oxygen, passivation interlayer material, and material of the facet surface therebetween to form graded layers of oxidized material of the facet surface and passivation interlayer material; and (d) depositing, upon the passivation interlayer, a passivation capping layer of a material having the ability to intermix with the oxide layer and passivation interlayer so as to exchange oxygen, passivation interlayer material, passivation capping layer material, and material of the facet surface therebetween to form graded layers of oxidized material of the facet surface, passivation interlayer material, and passivation capping layer material, the passivation capping layer material comprising $Ga_2O_3(Gd_2O_3)$.

* * * * *

UNITED STATES PATENT AND TRADEMARK OFFICE
CERTIFICATE OF CORRECTION

PATENT NO. : 6,933,244 B2
DATED : August 23, 2005
INVENTOR(S) : William D. Goodhue It is certified that error appears in the above-identified patent and that said Letters Patent is hereby corrected as shown below:

Column 1,
Line 5, insert the following paragraph:
-- This invention was made with government support under Contract Number F19628-00-C-0002, awarded by the Air Force. The government has certain rights in the invention. --.

Signed and Sealed this

Twenty-fourth Day of January, 2006

JON W. DUDAS
*Director of the United States Patent and Trademark Office*